(12) United States Patent
Apel et al.

(10) Patent No.: US 8,164,387 B1
(45) Date of Patent: Apr. 24, 2012

(54) SIMULTANEOUS HARMONIC TERMINATION IN A PUSH-PULL POWER AMPLIFIER

(75) Inventors: Thomas R. Apel, Portland, OR (US); Jun Zhao, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 12/828,134

(22) Filed: Jun. 30, 2010

(51) Int. Cl.
*H03F 3/26* (2006.01)
(52) U.S. Cl. ........................ 330/276; 330/305
(58) Field of Classification Search ............ 330/276, 330/305
See application file for complete search history.

(56) References Cited

U.S. PATENT DOCUMENTS

| | | |
|---|---|---|
| 5,300,895 A | 4/1994 | Jones |
| 5,329,249 A | 7/1994 | Cripps |
| 5,347,229 A | 9/1994 | Suckling |
| 7,215,221 B1 | 5/2007 | Ellis |
| 7,471,156 B2 | 12/2008 | Thompson |

OTHER PUBLICATIONS

Granberg, Helge O., "Linear Amplifiers for Mobile Operation," AN-762, Motorola Semiconductor Products, Inc., Phoenix, AZ, 1993.

*Primary Examiner* — Khanh Nguyen
(74) *Attorney, Agent, or Firm* — Schwabe Williamson & Wyatt

(57) ABSTRACT

Embodiments of circuits and systems for a harmonic tuning network coupled with a radio frequency (RF) push-pull power amplifier to terminate both second- and third-harmonic energies are disclosed. Other embodiments may also be described and claimed.

26 Claims, 9 Drawing Sheets

SIMULTANEOUS HARMONIC TERMINATION IN A PUSH-PULL POWER AMPLIFIER

FIELD

Embodiments of the present disclosure relate generally to the field of circuits, and more particularly to simultaneous harmonic termination in a push-pull power amplifier.

BACKGROUND

Push-pull power amplifiers are used in wireless transmission devices to amplify a differential radio frequency (RF) signal prior to transmission. In a push-pull power amplifier, second-harmonic energy resides primarily in common mode current flows, while third-harmonic energy resides primarily in differential mode current flows. Properly terminating energy at both of these harmonic frequencies may improve efficiency and linearity of the push-pull power amplifier.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, "coupled with" may mean either one or both of the following: a direct coupling or connection, where there is no other element coupled or connected between the elements that are said to be coupled with each other; or an indirect coupling or connection, where one or more other elements are coupled or connected between the elements that are said to be coupled with each other.

Figure 1:
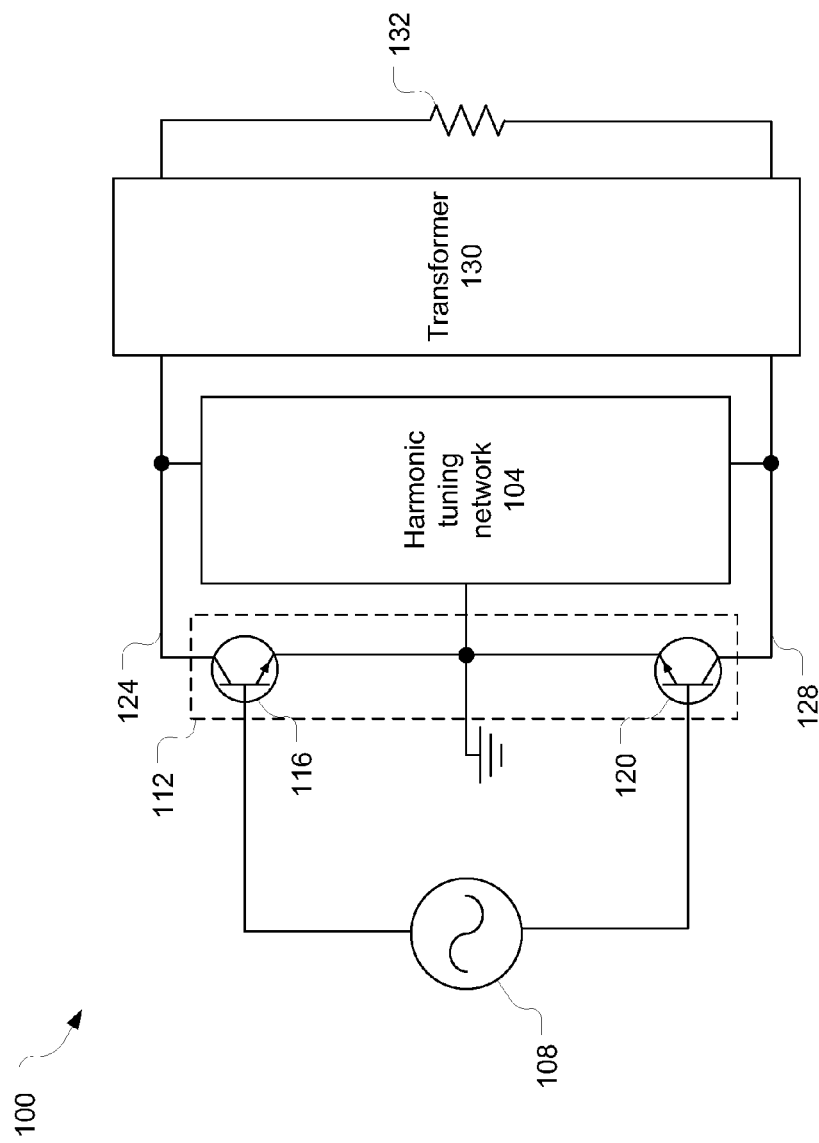
FIG. 1 illustrates a circuit including a harmonic tuning network and transformer in accordance with various embodiments.

FIG. 1 illustrates a circuit 100 including a harmonic tuning network 104 in accordance with some embodiments. The circuit 100, which may be included in amplification circuitry, may include an RF signal source 108 that is coupled with an output stage 112 of a push-pull power amplifier. As will be readily understood, the push-pull power amplifier may include other sections, e.g., an input stage, an intermediate stage, etc., not explicitly shown in FIG. 1. The output stage 112 may include a first transistor 116 to receive a first portion of the differential RF signal and a second transistor 120 to receive a second portion of the differential RF signal. The first and second portions may be driven 180 degrees out-of-phase with respect to one another.

The first transistor 116 may include a base that receives the first portion of the differential RF signal from the RF signal source 108, a collector coupled with a transmission line 124, and an emitter coupled with ground. Similarly, the second transistor 120 may include a base that receives the second portion of the differential RF signal from the RF signal source 108, a collector that is coupled with a transmission line 128, and an emitter that is coupled with ground. While the output stage 112 is shown with bipolar junction transistors in FIG. 1, other embodiments may include other types of transistors or active power devices.

The harmonic tuning network 104 may simultaneously terminate both second-harmonic energy residing in common mode current flows and third-harmonic energy residing in differential mode current flows. As used herein, common mode current flows refers to in-phase currents flowing on opposite branches of a symmetric circuit. For example, currents flowing in transmission lines 124 and 128 are considered common mode current flows if they are in-phase. As used herein, differential mode current flows refers to current flows that are 180 degrees out-of-phase in opposite branches of a symmetric circuit. For example, currents flowing on transmission lines 124 and 128 are considered differential mode current flows if they are 180 degrees out-of-phase.

Figure 2:
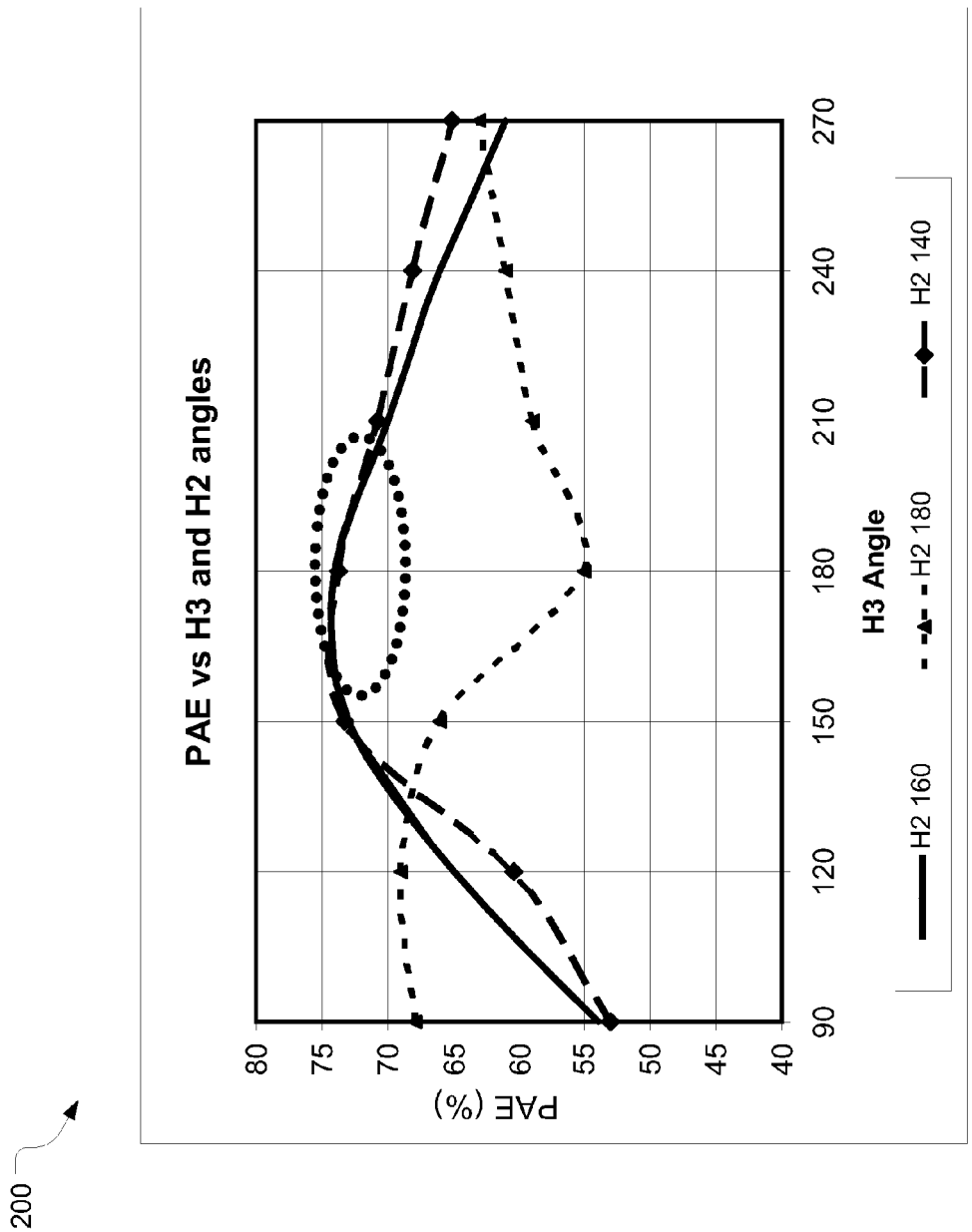
FIG. 2 is a graph depicting relationships between power-added efficiency and phase angles of second-harmonic frequency impedance and third-harmonic frequency impedance in accordance with various embodiments.
Figure 3:
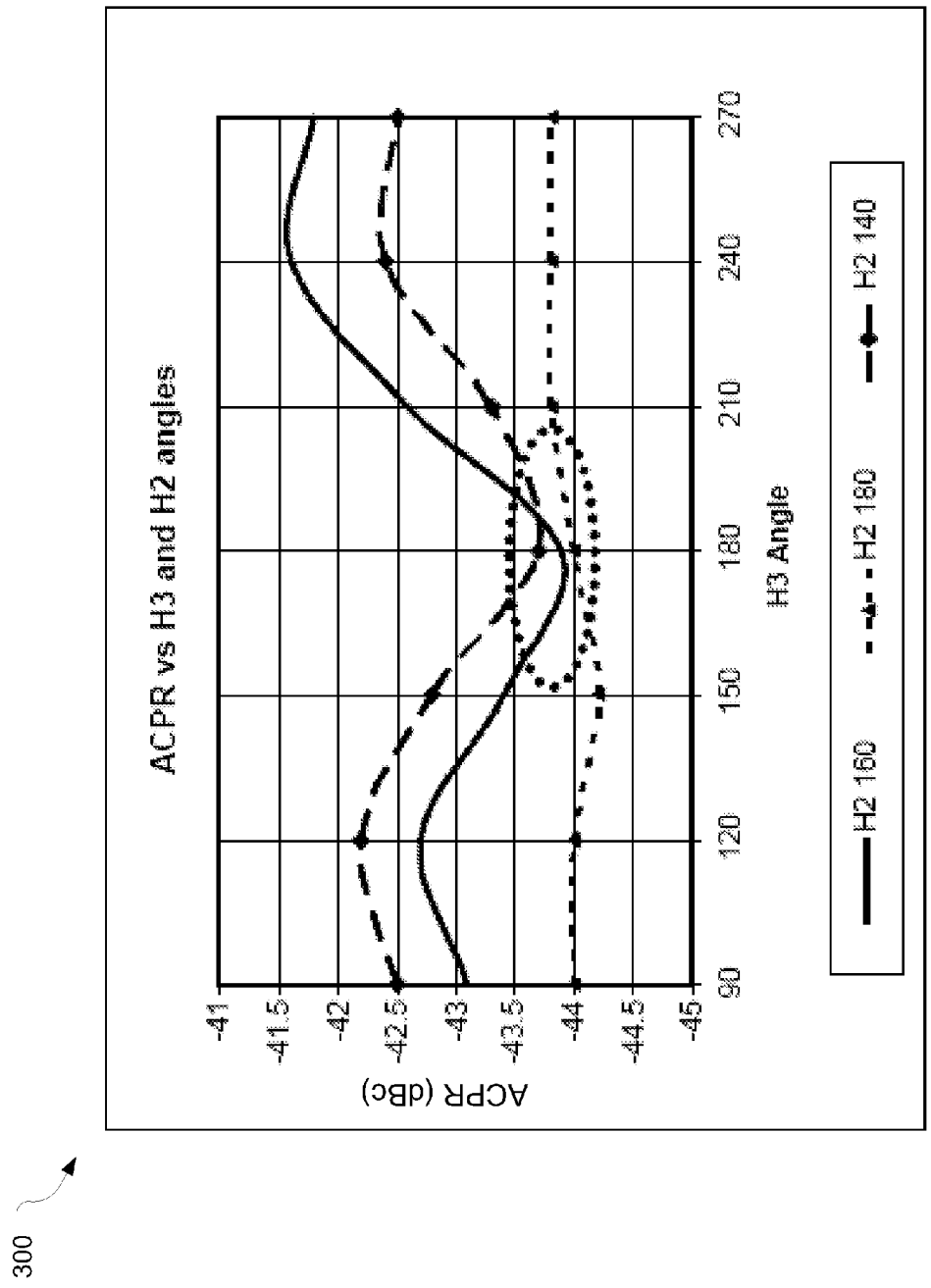
FIG. 3 is a graph depicting relationships between adjacent channel power ratio and phase angles of second-harmonic frequency impedance and third-harmonic frequency impedance in accordance with various embodiments.

The harmonic tuning network 104 may provide simultaneous terminations by providing a desired impedance along a return path for signal energy in the second and third harmonic frequencies. The desired impedance may depend on the application in which the harmonic tuning network 104 is deployed. In general, a saturated power amplifier used for communicating in compliance with a Global System for Mobile Communications (GSM) standard, for example, may desire a short at the third-harmonic frequency, while a linear PA used for communicating in compliance with a wireless code division multiple access (W-CDMA) standard, for example, may desire a short at the second-harmonic frequency. For a multimode PA, which targets both linear and saturated PA performance, a low resistance may be desired at both the second- and third-harmonic frequencies with respective phase angles adjusted to satisfy performance objectives for the multiple modes. A short at the second-harmonic frequency may not be desired for saturated performance. Thus, the impedance at the second-harmonic frequency may be inductive with a phase angle of approximately 140-160 degrees; while the impedance at the third-harmonic frequency is approximately 180 degrees. This may be shown graphically by graphs 200 and 300 respectively depicted in FIGS. 2 and 3. In particular, graph 200 depicts a relationship between power-added efficiency (PAE), measured as a percentage reflecting an efficiency of a power amplifier, and various phase angles of second-harmonic frequency impedance (H2), and third-harmonic frequency impedance (H3). Graph 300 depicts a relationship between Adjacent Channel Power Ratio (ACPR), measured as decibels relative to a carrier (dBc), and various phase angles of H2 and H3.

The harmonic tuning network 104 may achieve the desired impedances at the second- and third-harmonic frequencies with low insertion losses as described below. Various topologies of the harmonic tuning network 104 will also be described below in further detail. The harmonic tuning network 104 may be coupled with a transformer 130, which may be coupled with an output load 132. The transformer 130 may provide an impedance match at a fundamental frequency and may also convert the amplified differential RF signal on the transmission lines 124 and 128 to an amplified single-ended RF signal for transmission. The transformer 130 may be, but is not limited to, a flux-coupled transformer, an autotransformer, a transmission-line transformer (e.g., a Guanella transformer), or an impedance-matching balun.

Figure 4:
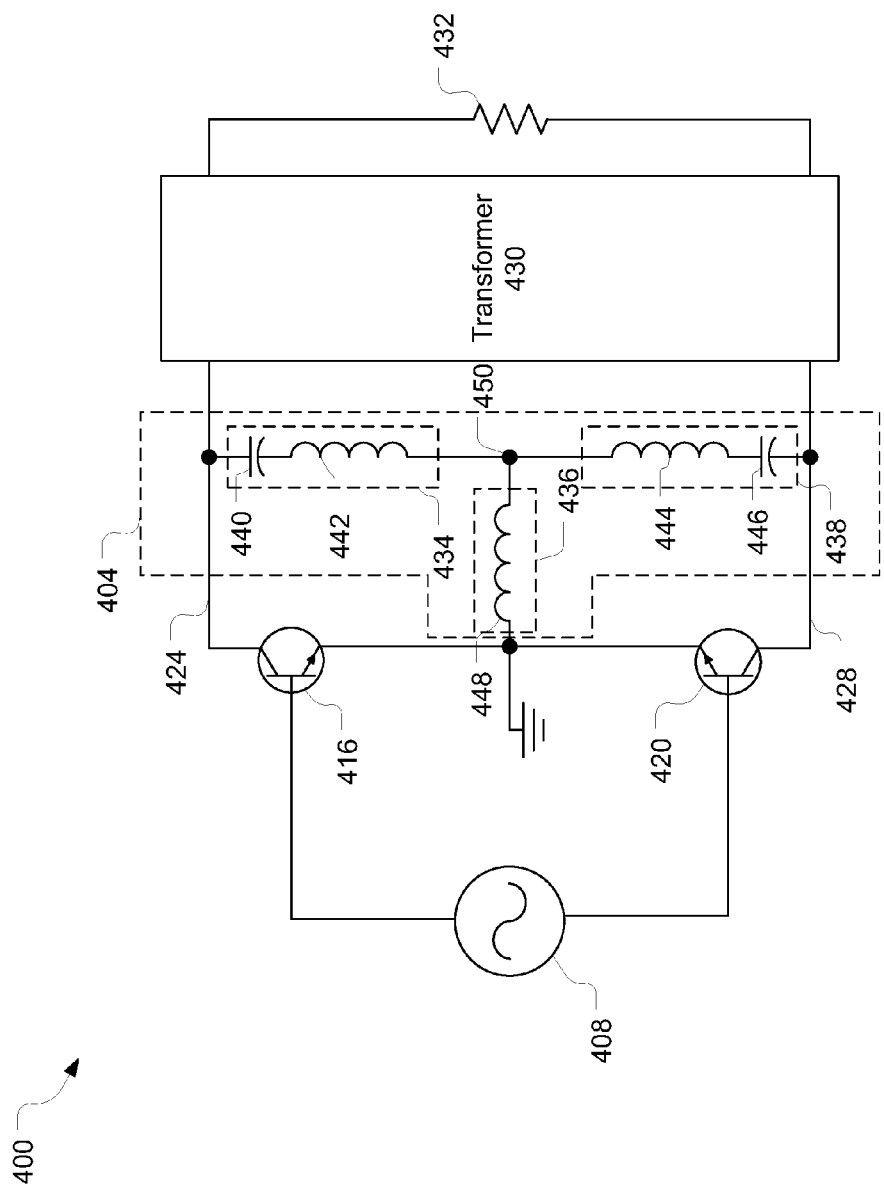
FIG. 4 illustrates another circuit including another harmonic tuning network in accordance with various embodiments.

FIG. 4 illustrates a circuit 400 including a harmonic tuning network 404 in accordance with some embodiments. The circuit 400 may be similar to circuit 100 with like-named or corresponding components operating in similar manners and being substantially interchangeable unless otherwise described. Similar to circuit 100, circuit 400 may include an RF signal source 408 coupled with transistors 416 and 420. The transistors 416 and 420 may be coupled with transmission lines 424 and 428, respectively. The harmonic tuning network 404 may also be coupled with transmission lines 424 and 428 and further coupled with a transformer 430.

In this embodiment, the harmonic tuning network 404, which may be referred to as a T-network, may include a number of inductor and/or capacitor (L/C) segments, e.g., L/C segment 434, L/C segment 436, and L/C segment 438. The L/C segment 434 may include a capacitor 440 and an inductor 442. The L/C segment 438 may include an inductor 444 and a capacitor 446. The harmonic tuning network 404 may be symmetrical in that the L/C segment 434 may be identical to L/C segment 438, e.g., both L/C segments include the same components that are of the same size. The L/C segment 436 may only include an inductor 448, which has a first terminal coupled with a node 450 that is between the L/C segment 434 and L/C segment 438. A second terminal of the inductor 448 may be coupled with ground.

While embodiments of the present disclosure show certain elements, e.g., inductors and/or capacitors, within the various L/C segments, other embodiments may have other elements that are configured to provide similar impedance matching characteristics. Thus, other embodiments are not limited to the elements of the L/C segments that are explicitly shown.

The return path for differential mode current flows will be a series resonant path that is between the transmission lines 424 and 428 and will include L/C segments 434 and 438. The return path for common mode current flows will include, in addition to L/C segments on the series resonant path, L/C segments on the path to ground, i.e., L/C segment 436. Thus, a first combination of L/C segments, which includes L/C segments 434 and 438, may be configured to terminate third-harmonic energy residing in the differential mode current flows, while a second combination of L/C segments, which includes L/C segments 434, 436, and 438, may be configured to terminate second-harmonic energy residing in the common mode current flows. In this manner, the L/C segment 436 may be used only in the tuning related to termination of the second-harmonic energy, thereby providing an additional degree of freedom in the design of the circuit 400.

Various embodiments take advantage of the separation of the common mode and differential mode of a push-pull amplifier. For example, the aforementioned symmetry of the harmonic tuning network 404 may also provide the node 450 as a virtual ground for differential mode current flows. Thus, the differential mode current flows do not go through the L/C segment 436 and, therefore, experience no loss. Meanwhile, all common mode current flows are in phase between transmission line 424 and 428, and flow through L/C segment 436, which may be configured, in conjunction with L/C segments 434 and 438, to terminate second-harmonic energy residing in the common mode current flows. Thus, termination of the second-harmonic energy is provided by the circuit 400 with no degradation to the fundamental and third harmonic signals. There is no loss in the L/C segment 436 for differential mode current flows, and there is no impedance shift to the fundamental and third harmonic frequencies. In this manner, circuit 400 reduces the loss and components while still achieving adjustable second- and third-harmonic impedances.

Figure 5:
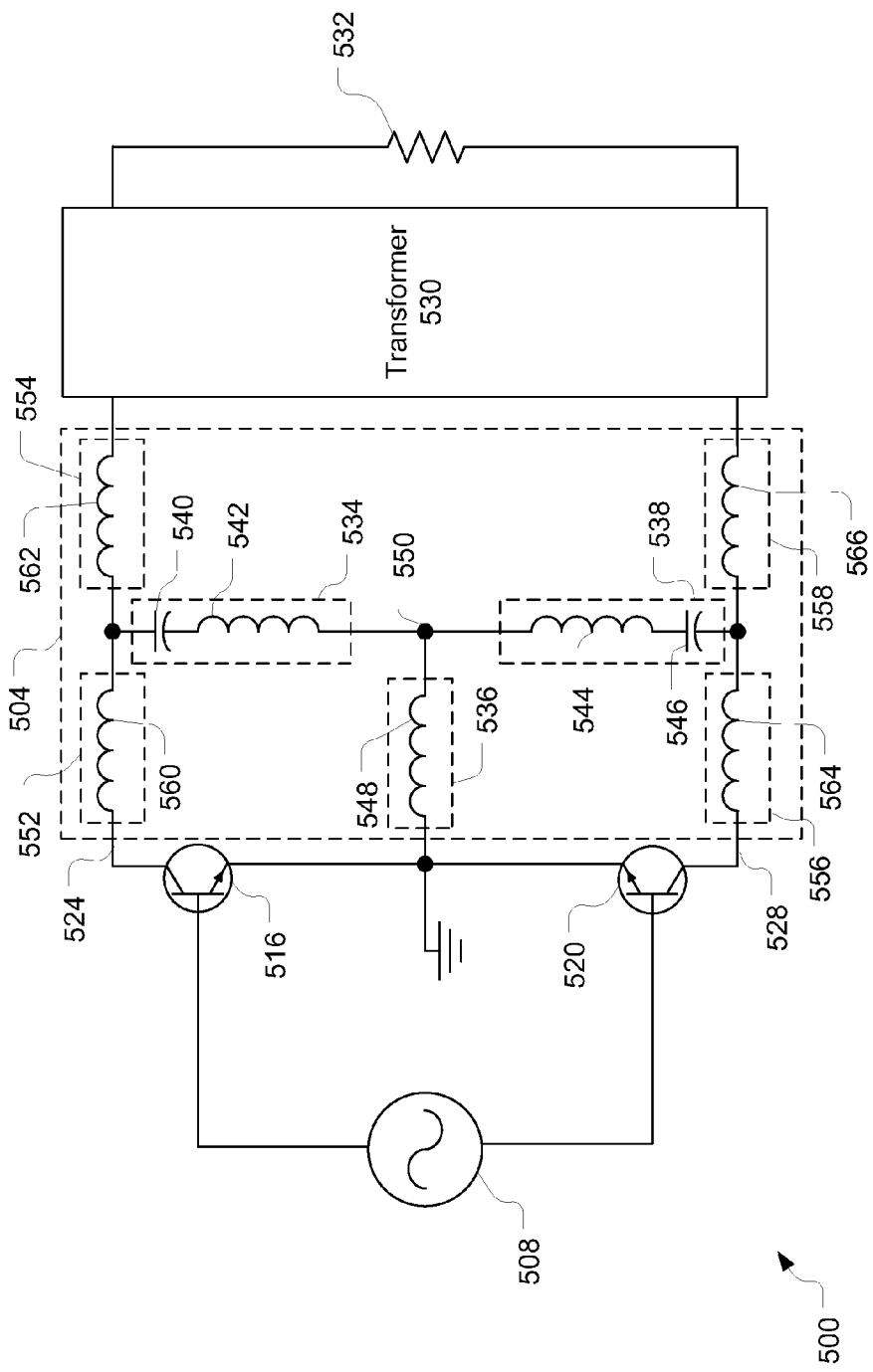
FIG. 5 illustrates another circuit including another harmonic tuning network in accordance with various embodiments.

FIG. 5 illustrates a circuit 500 including a harmonic tuning network 504 in accordance with some embodiments. The circuit 500 may be similar to circuit 400 with like-named or corresponding components operating in similar manners and being substantially interchangeable unless otherwise described. Similar to circuit 400, circuit 500 may include an RF signal source 508 coupled with transistors 516 and 520. The transistors 516 and 520 may be coupled with transmission lines 524 and 528, respectively. The harmonic tuning network 504 may also be coupled with transmission lines 524 and 528 and further coupled with a transformer 530.

The harmonic tuning network 504 may include a number of L/C segments, e.g., L/C segments 534, 536, and 538, arranged as a T-network, similar to harmonic tuning network 404. In addition to the T-network of L/C segments, the harmonic tuning network 504 may also include a number of L/C segments integrated into transmission lines 524 and 528. For example, harmonic tuning network 504 may include L/C segments 552 and 554 integrated into transmission line 524; and L/C segments 556 and 558 integrated into transmission line 528. The L/C segments 552, 554, 556, and 558 may include inductors 560, 562, 564, and 566, respectively. Integrating L/C segments into transmission lines, as shown, provides additional freedom in setting the desired impedance termination for the differential mode energy of the third harmonic and the common mode energy of the second harmonic. Integrating L/C segments into transmission lines may also lessen any perturbing effect that the harmonic tuning network 504 may cause, at the fundamental frequency, to the desired power flow through the transformer 530 to the load 532.

Figure 6:
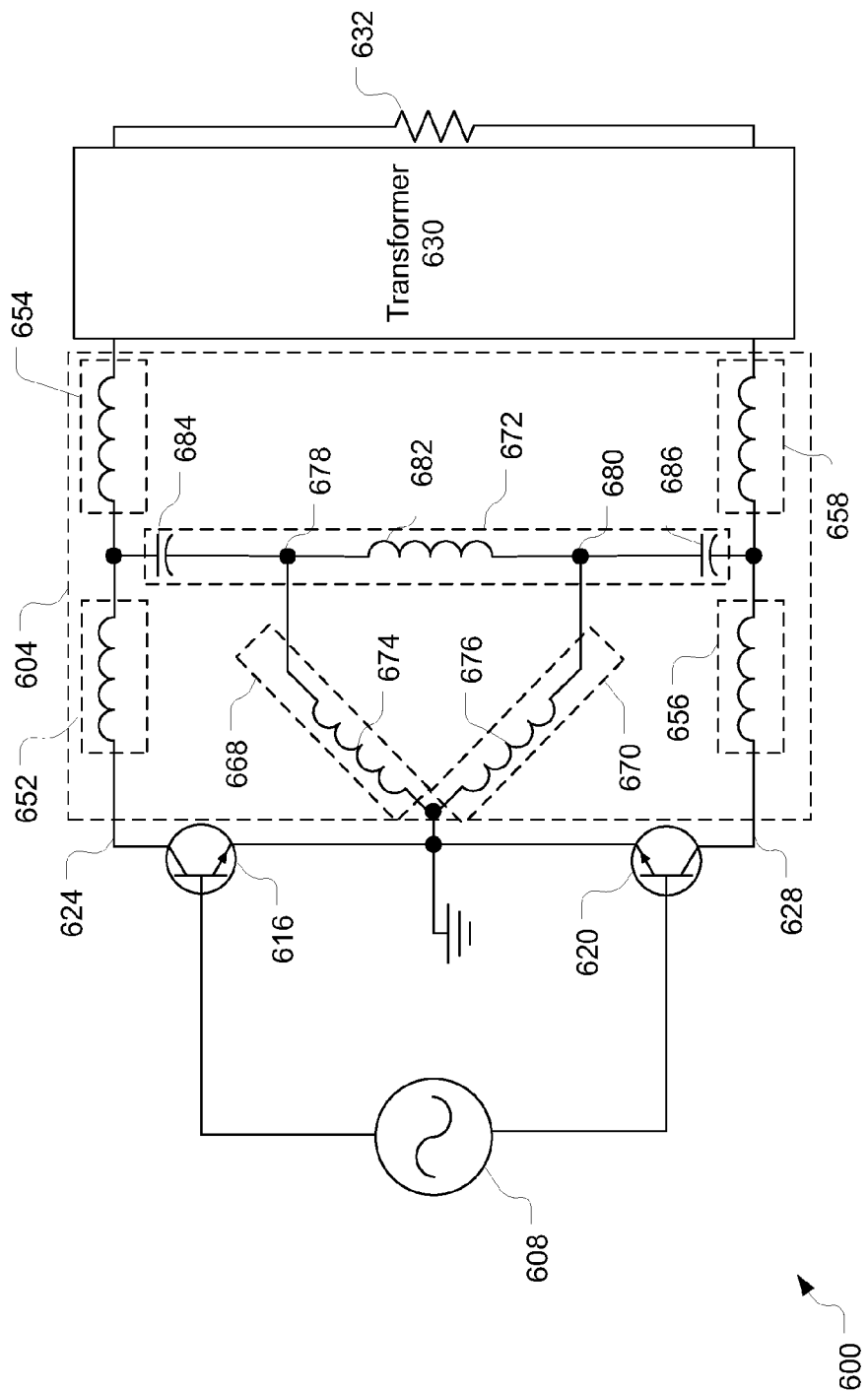
FIG. 6 illustrates another circuit including another harmonic tuning network in accordance with various embodiments.

FIG. 6 illustrates a circuit 600 including a harmonic tuning network 604 in accordance with some embodiments. The circuit 600 may be similar to circuit 500 with like-named or corresponding components operating in similar manners and being substantially interchangeable unless otherwise described. Similar to circuit 500, circuit 600 may include an RF signal source 608 coupled with transistors 616 and 620 of an output stage of a push-pull amplifier. The transistors 616 and 620 may be coupled with transmission lines 624 and 628, respectively. The harmonic tuning network 604 may also be coupled with transmission lines 624 and 628 and further coupled with a transformer 630.

The harmonic tuning network 604 may include L/C segments 652 and 654 integrated into transmission line 624; and L/C segments 656 and 658 integrated into transmission line 628. In some embodiments, these L/C segments may be excluded, similar to circuit 400.

The harmonic tuning network 604 may also include L/C segments 668 and 670, and inductor 682 arranged as a pi network. L/C segments 668 and 670 may include inductors 674 and 676, respectively. Inductor 674 may include a first terminal coupled with ground and a second terminal coupled with a node 678. Inductor 676 may include a first terminal coupled with ground and a second terminal coupled with node 680. The inductor 682, which may be included in L/C segment 672, may have a first terminal coupled with node 678 and a second terminal coupled with node 680. The L/C segment 672 may also include a capacitor 684 having a first terminal coupled with the transmission line 624 and a second terminal coupled with the node 678; and a capacitor 686 having a first terminal coupled with node 680 and a second terminal coupled with transmission line 628.

The pi network of harmonic tuning network 604 may be equivalent to the T-network of harmonic tuning network 504, with the equivalent impedance values being determined by T-to-pi transformations as follows:

$$Z_{LCa} = Z_{LC1} + 2Z_{LC2}; \qquad \text{and Equation 1}$$

$$Z_{LCb} = \frac{Z_{LC1}^2 + 2Z_{LC1}Z_{LC2}}{Z_{LC2}}; \qquad \text{Equation 2}$$

where $Z_{LCa}$ is an impedance of inductors 674 and 676; $Z_{LCb}$ is an impedance of inductor 682; $Z_{LC1}$ is an impedance of inductors 542 and 544, and $Z_{LC2}$ is an impedance of inductor 548.

It may be noted that $Z_{L/C}$ as used herein represents an impedance of an inductor portion of a corresponding L/C segment. Utilizing the transformation equations in this manner may provide inductor-based transformations. This applies equally to T-to-pi transformations and to pi-to-T transformations. In other embodiments, the transformation terms may be appropriately modified to provide inductor- and capacitor-based transformations or capacitor-based transformations of the L/C segments.

Figure 7:
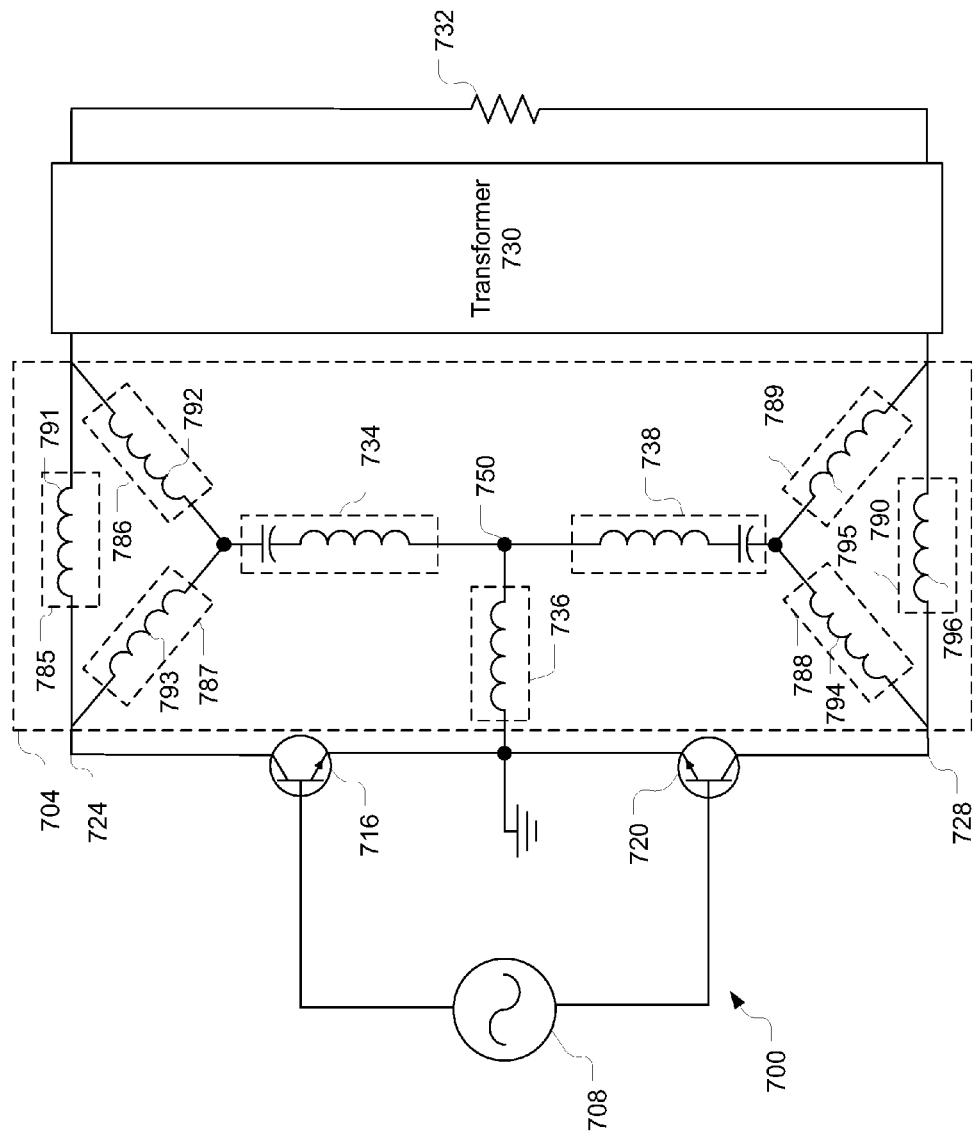
FIG. 7 illustrates another circuit including another harmonic tuning network in accordance with various embodiments.

FIG. 7 illustrates a circuit 700 including a harmonic tuning network 704 in accordance with some embodiments. The circuit 700 may be similar to circuit 500 with like-named or corresponding components operating in similar manners and being substantially interchangeable unless otherwise described. Similar to circuit 500, circuit 700 may include an RF signal source 708 coupled with transistors 716 and 720 of an output stage of a push-pull amplifier. The transistors 716 and 720 may be coupled with transmission lines 724 and 728, respectively. The harmonic tuning network 704 may also be coupled with transmission lines 724 and 728 and further coupled with a transformer 730.

The harmonic tuning network 704 may include L/C segments 734, 736, and 738 arranged in a T-network similar to L/C segments 534, 536, and 538 of harmonic tuning network 504. However, in this embodiment, a portion of the impedance value of L/C segment 534 may be incorporated into a pi network of L/C segments 785, 786, and 787. Thus, the pi network of L/C segments 785, 786, and 787 may be equivalent to the T network of L/C segments 552, 554, and part of 534. Similarly, a portion of the impedance value of L/C segment 538 may be incorporated into a pi network of L/C segments 788, 789, and 790. Thus, the pi network of L/C segments 788, 789, and 790 may be equivalent to the T network of L/C segments 556, 558, and part of 538. In some embodiments, each of the L/C segments 785, 786, 787, 788, 789, and 790 may respectively include an inductor 791, 792, 793, 794, 795, and 796.

The equivalent impedance values of the pi networks of the harmonic tuning network 704 may be determined by a T-to-pi transformation as follows:

$$Z_{L/Cc} = \frac{Z_{L/C1\_p}Z_{L/C3} + Z_{L/C1\_p}Z_{L/C4} + Z_{L/C3}Z_{L/C4}}{Z_{L/C1\_p}}; \qquad \text{Equation 3}$$

$$Z_{L/Cd} = \frac{Z_{L/C1\_p}Z_{L/C3} + Z_{L/C1\_p}Z_{L/C4} + Z_{L/C3}Z_{L/C4}}{Z_{L/C4}}; \qquad \text{Equation 4}$$

$$Z_{L/Ce} = \frac{Z_{L/C1\_p}Z_{L/C3} + Z_{L/C1\_p}Z_{L/C4} + Z_{L/C3}Z_{L/C4}}{Z_{L/C3}}; \qquad \text{Equation 5}$$

where $Z_{L/Cc}$ is an impedance of inductors 791 and 796; $Z_{L/Cd}$ is an impedance of inductors 793 and 794; $Z_{L/Ce}$ is an impedance of inductors 792 and 795; $Z_{L/C1\_p}$ is a portion of an impedance of inductors 542 and 544 that is incorporated into respective pi networks; $Z_{L/C3}$ is an impedance of inductors 560 and 564; and $Z_{L/C4}$ is an impedance of inductors 562 and 566.

In embodiments in which the harmonic tuning network 704 is coupled with the transformer 730 by bond wire, the L/C segments 785, 786, 789, and 790 may be realized by the bond wires themselves. It may be desirable for an embodiment in which a harmonic tuning network is implemented as a flip chip to utilize the equivalent structure that is shown in FIG. 5, where inductors 562 and 566 represent flip-chip interface inductors.

Figure 8:
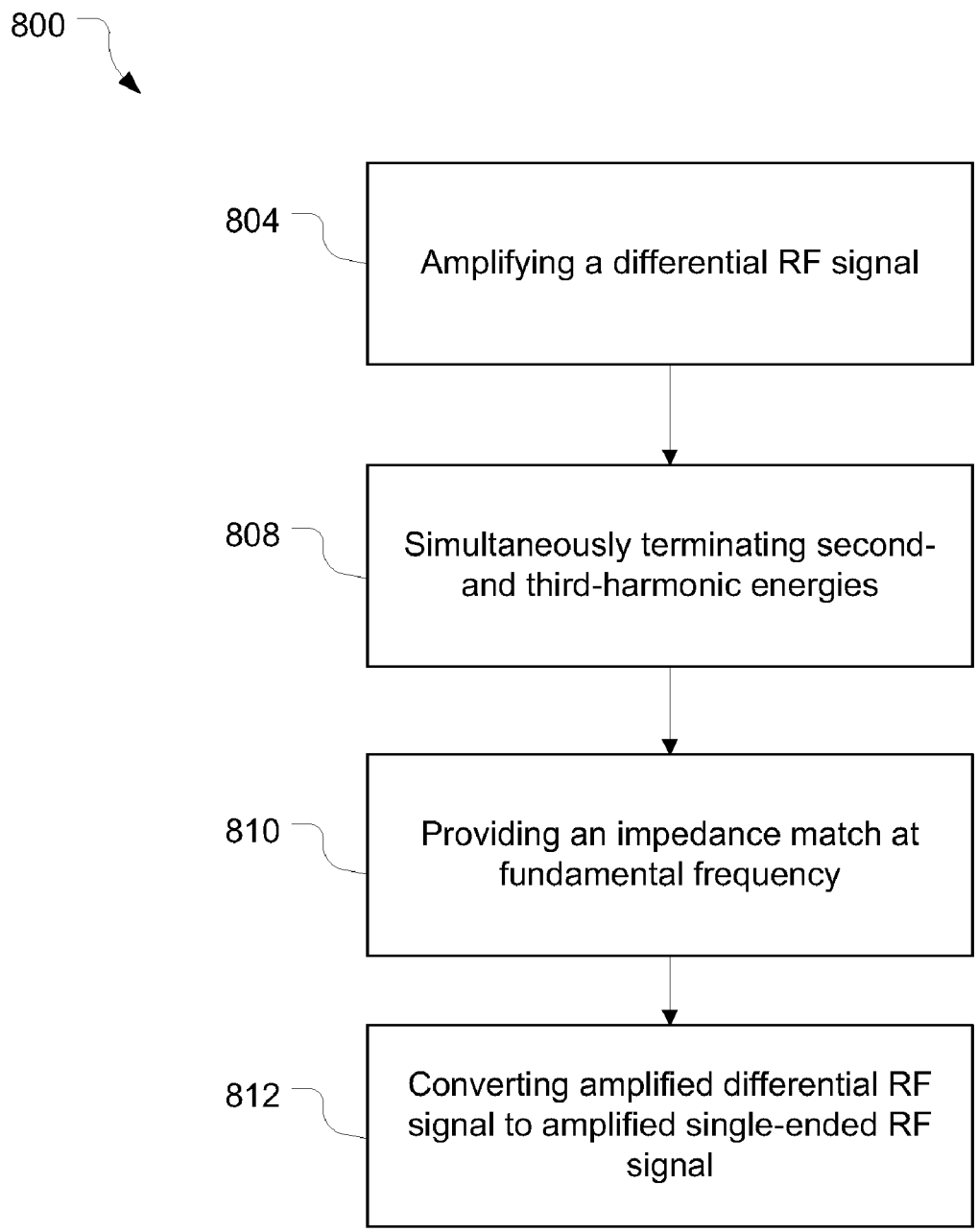
FIG. 8 is a flowchart illustrating operation of a circuit in accordance with various embodiments.

FIG. 8 is a flowchart 800 illustrating operation of an amplification circuit in accordance with various embodiments. At block 804, the operation may include amplifying a differential RF signal with a push-pull amplifier and outputting the amplified differential signal along a pair of transmission lines. At block 808, the operation may include simultaneously terminating second- and third-harmonic energies respectively residing in common mode and differential mode current flows. This simultaneous termination may be accomplished by use of any of the previously discussed harmonic tuning networks. At block 810, the operation may include providing an impedance match at a fundamental frequency, to efficiently transfer the fundamental frequency energy, from the amplifying transistors, to an external load. Fundamental frequency energy resides primarily in the differential mode current flows. At block 812, the operation may include converting the amplified differential RF signal to an amplified single-ended RF signal. As previously described, the providing of the impedance match and converting may be done by a transformer.

Figure 9:
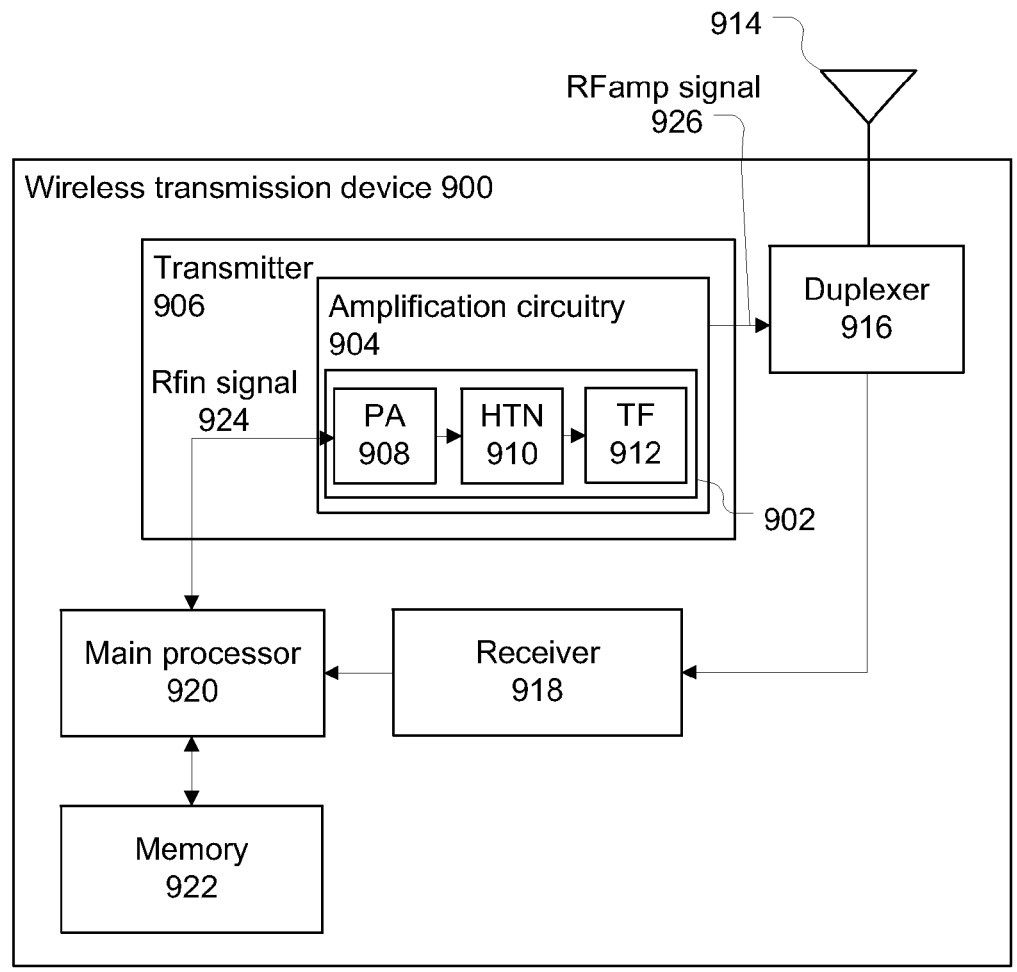
FIG. 9 is a wireless transmission device incorporating one of the circuits of FIG. 1, 4, 5, 6, or 7 in accordance with various embodiments.

The circuits 100, 400, 500, 600, and 700 may be incorporated into any of a variety of apparatuses and systems. A block diagram of an exemplary wireless transmission device 900 incorporating one of the circuits 100, 400, 500, 600, and 700 (represented by 902) into amplification circuitry 904 of a transmitter 906 that includes a push-pull power amplifier (PA) 908, a harmonic tuning network (HTN) 910, and a transformer (TF) 912 is illustrated in FIG. 9. In addition to the transmitter 906, the wireless transmission device 900 may have an antenna structure 914, a duplexer 916, a receiver 918, a main processor 920, and a memory 922 coupled with each other at least as shown. While the wireless transmission device 900 is shown with transmitting and receiving capabilities, other embodiments may include wireless transmission devices without receiving capabilities.

In various embodiments, the wireless transmission device 900 may be, but is not limited to, a mobile telephone, a paging device, a personal digital assistant, a text-messaging device, a portable computer, a desktop computer, a telecommunications base station, a subscriber station, an access point, a radar, a satellite communication device, or any other device capable of wirelessly transmitting RF signals.

The main processor 920 may execute a basic operating system program, stored in the memory 922, in order to control the overall operation of the wireless transmission device 900. For example, the main processor 920 may control the reception of signals and the transmission of signals by receiver 918 and transmitter 906. The main processor 920 may be capable of executing other processes and programs resident in the memory 922 and may move data into or out of memory 922, as desired by an executing process.

The transmitter 906 may receive outgoing data (e.g., voice data, web data, e-mail, signaling data, etc.) from the main processor 920, may generate an RFin signal 924 to represent the outgoing data, and provide the RFin signal 924 to the amplification circuitry 904.

The amplification circuitry 904 may amplify the RFin signal 924 to provide an amplified RFamp signal 926, which may be forwarded to the duplexer 916 and then to the antenna structure 914 for an over-the-air (OTA) transmission.

In a similar manner, the receiver 918 may receive an incoming OTA signal from the antenna structure 914 through the duplexer 916. The receiver 918 may process and send the incoming signal to the main processor 920 for further processing.

In various embodiments, the antenna structure 914 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
    a push-pull power amplifier configured to amplify a differential signal, the push-pull amplifier having a plurality of output stage transistors including a first transistor and a second transistor;
    a harmonic tuning network coupled with the push-pull power amplifier and having at least one inductor and/or capacitor (L/C) segment configured to simultaneously terminate second-harmonic energy residing in common mode current flows and third-harmonic energy residing in differential mode current flows;
    a transformer coupled with the harmonic tuning network;
    a first transmission line coupled with the first transistor, the harmonic tuning network, and the transformer; and
    a second transmission line coupled with the second transistor, the harmonic tuning network, and the transformer, wherein the harmonic tuning network is coupled between the first transmission line and the second transmission line.

2. The circuit of claim 1, wherein the transformer is configured to convert the differential signal to a single-ended signal.

3. The circuit of claim 1, wherein the harmonic tuning network includes:
    a first L/C segment coupled with the first transmission line and a node;
    a second L/C segment, which is identical to the first L/C segment, coupled with the second transmission line and the node; and
    a third L/C segment coupled with ground and the node.

4. The circuit of claim 3, wherein the first L/C segment includes a first inductor and a first capacitor and the second segment includes a second inductor and a second capacitor.

5. The circuit of claim 4, wherein the third L/C segment comprises a third inductor.

6. The circuit of claim 5, wherein a first combination of the first and second L/C segments is configured to terminate the third-harmonic energy residing in the differential mode current flows and a second combination of the first L/C segment, the second L/C segment, and the third L/C segment is configured to terminate the second-harmonic energy residing in the common mode current flows.

7. The circuit of claim 3, wherein the harmonic tuning network further comprises:
    a fourth L/C segment and a fifth L/C segment integrated with the first transmission line; and
    a sixth L/C segment and a seventh L/C segment integrated with the second transmission line.

8. The circuit of claim 7, wherein each of the fourth L/C segment, fifth L/C segment, sixth L/C segment, and the seventh L/C segments respectively include an inductor.

9. The circuit of claim 1, wherein the harmonic tuning network includes:
    a first L/C segment coupled with and between the first transmission line and the second transmission line;
    a second L/C segment coupled with the first segment and a ground; and
    a third L/C segment coupled with the first segment and the ground.

10. The circuit of claim 9, wherein the first L/C segment comprises:
    a first capacitor, an inductor, and a second capacitor coupled in series with one another.

11. The circuit of claim 10, wherein the inductor is a first inductor; the second L/C segment comprises a second inductor coupled with the first L/C segment at a first node that is between the first capacitor and the first inductor; and the third L/C segment comprises a third inductor coupled with the first L/C segment at a second node that is between the first inductor and the second capacitor.

12. The circuit of claim 11, wherein the harmonic tuning network further comprises:
a fourth L/C segment and a fifth L/C segment integrated with the first transmission line; and
a sixth L/C segment and a seventh L/C segment integrated with the second transmission line.

13. The circuit of claim 3, further comprising:
a first pi network of L/C segments integrated into the first transmission line and coupled with the first L/C segment; and
a second pi network of L/C segments integrated into the second transmission line and coupled with the second L/C segment.

14. The circuit of claim 1, wherein the at least one L/C segment includes an inductor and a capacitor coupled in series with one another.

15. A method comprising:
amplifying, with a push-pull power amplifier that has a plurality of output stage transistors including a first transistor coupled with a first transmission line and a second transistor coupled with a second transmission line, a differential radio frequency signal;
simultaneously terminating, with a harmonic tuning network that is coupled between the first and second transmission lines, second-harmonic energy residing in common mode current flows and third-harmonic energy residing in differential mode current flows; and
converting, with a transformer, the differential RF signal into a single-ended RF signal.

16. The method of claim 15, further comprising:
providing, with the transformer, an impedance match at a fundamental frequency.

17. The method of claim 15, wherein said simultaneously terminating further comprises:
terminating the third-harmonic energy with a first combination of first and second segments; and
terminating the second-harmonic energy with a second combination of the first segment, the second segment, and a third segment.

18. A system comprising:
amplification circuitry including:
a push-pull power amplifier configured to amplify a differential radio-frequency (RF) signal and output the amplified differential RF signal on a first transmission line and a second transmission line;
a harmonic tuning network coupled with the first transmission line and the second transmission line and including a segment with an inductor coupled in series with a capacitor, the harmonic tuning network configured to terminate both second-harmonic energy residing in common mode current flows and third-harmonic energy residing in differential mode current flows; and
a transformer coupled with the first transmission line and the second transmission line and configured to convert the amplified differential RF signal to an amplified single-ended RF signal; and
an antenna structure coupled with the amplification circuitry and configured to facilitate an over-the-air (OTA) transmission of the amplified single-ended RF signal.

19. The system of claim 18, wherein the harmonic tuning network is further configured to simultaneously terminate both the second-harmonic energy and the third-harmonic energy.

20. The system of claim 18, wherein the segment is a first segment coupled with the first transmission line and a node and the harmonic tuning network further includes:
a second segment, which is identical to the first segment, coupled with the second transmission line and the node; and
a third segment coupled with ground and the node.

21. The system of claim 18, wherein the harmonic tuning network includes a T network of segments, with each segment including an inductor and/or a capacitor.

22. The system of claim 18, wherein the harmonic tuning network includes a pi network of segments, with each segment including an inductor and/or a capacitor.

23. The system of claim 18, wherein the harmonic tuning network includes a T network and a pi network of segments, with each segment including an inductor and/or a capacitor.

24. A circuit comprising:
a push-pull power amplifier configured to amplify a differential signal and output the amplified differential signal along a pair of transmission lines;
a harmonic tuning network coupled with the push-pull power amplifier and having a first inductor and/or capacitor (L/C) segment and a second L/C segment, coupled with one another in series and between the pair of transmission lines, the first and second L/C segments configured to terminate both second-harmonic energy residing in common mode current flows and third-harmonic energy residing in differential mode current flows, and further configured to provide a virtual ground between the first L/C segment and the second L/C segment for differential mode current flows; and
a transformer coupled with the harmonic tuning network.

25. The circuit of claim 24, further comprising:
a third L/C segment coupled with the node and ground and configured to terminate, in conjunction with the first and second L/C segments, second-harmonic energy residing in the common mode current flows.

26. The circuit of claim 25, wherein the first L/C segment includes a first inductor and a first capacitor, the second L/C segment includes a second inductor and a second capacitor, and the third L/C segment includes a third inductor.

* * * * *